(12) United States Patent  
Shinya et al.

(10) Patent No.: US 7,060,939 B2
(45) Date of Patent: Jun. 13, 2006

(54) SUBSTRATE HEATING METHOD, SUBSTRATE HEATING SYSTEM, AND APPLYING DEVELOPING SYSTEM

(75) Inventors: Hiroshi Shinya, Koshi-Machi (JP); Takahiro Kitano, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 126 days.

(21) Appl. No.: 10/377,802

(22) Filed: Mar. 4, 2003

(65) Prior Publication Data

US 2003/0166305 A1    Sep. 4, 2003

(30) Foreign Application Priority Data

Mar. 4, 2002  (JP) .............................. 2002-105834

(51) Int. Cl.
   *F27B 5/14*    (2006.01)
(52) U.S. Cl. ...................... 219/390; 219/405; 219/411; 392/416; 392/418; 118/724; 118/725; 118/50.1; 118/728; 118/715
(58) Field of Classification Search ................ 219/390, 219/405, 411; 392/416, 418; 118/724, 725, 118/50.1, 728, 729, 715, 720, 721
   See application file for complete search history.

(56) References Cited

U.S. PATENT DOCUMENTS

| 6,140,256 | A | * | 10/2000 | Ushikawa ................... 438/795 |
| 6,203,969 | B1 | | 3/2001 | Ueda |
| 6,419,803 | B1 | * | 7/2002 | Baldwin et al. ....... 204/192.13 |
| 6,709,523 | B1 | * | 3/2004 | Toshima et al. ............. 118/725 |
| 6,829,559 | B1 | * | 12/2004 | Bultman et al. ............ 702/155 |

FOREIGN PATENT DOCUMENTS

JP            3-135011       *  6/1991

* cited by examiner

*Primary Examiner*—Shawntiná Fuqua
(74) *Attorney, Agent, or Firm*—Oblon, Spivak, McClelland, Maier & Neustadt, P.C.

(57) ABSTRACT

A substrate on which a resist solution is applied is mounted on a heating plate in a processing vessel. Then, a purge gas is supplied into the processing vessel, and heating is started. Above the mounting position of the substrate, a thickness detecting sensor for monitoring the thickness of the resist film formed on the surface of the substrate is provided. When the thickness becomes a predetermined value or less, a control part causes a lift pin to upwardly move so as to increase the distance between the substrate and the heating plate. Thus, the heating value applied to the substrate decreases, and thereafter, only the solvent is volatilized without having a bad influence on a polymer in the resist film.

17 Claims, 8 Drawing Sheets

SUBSTRATE HEATING METHOD, SUBSTRATE HEATING SYSTEM, AND APPLYING DEVELOPING SYSTEM

TECHNICAL FIELD

The present invention relates generally to a substrate heating method and system for volatilizing a solvent from the surface of a substrate, on which a resist solution is applied, by heating the substrate, and an applying and developing system to which the substrate heating system is applied.

BACKGROUND ART

In processes for producing semiconductor devices and LCDs, a resist processing to a processing substrate is carried out by a technique called photolithography. This technique is carried out by a series of steps of applying a resist solution on, e.g., a semiconductor wafer (which will be hereinafter referred to as a wafer), to form a liquid film on the surface of the wafer, exposing the resist film by a photo mask, and thereafter, carrying out a developing processing. In such steps, twice heating processes called PAB (Post Applied Bake) and PEB (Post Exposure Bake) are carried out before and after the exposure processing. The heating processing in the PAB uses a system shown in, e.g., FIG. 8.

Figure 8:
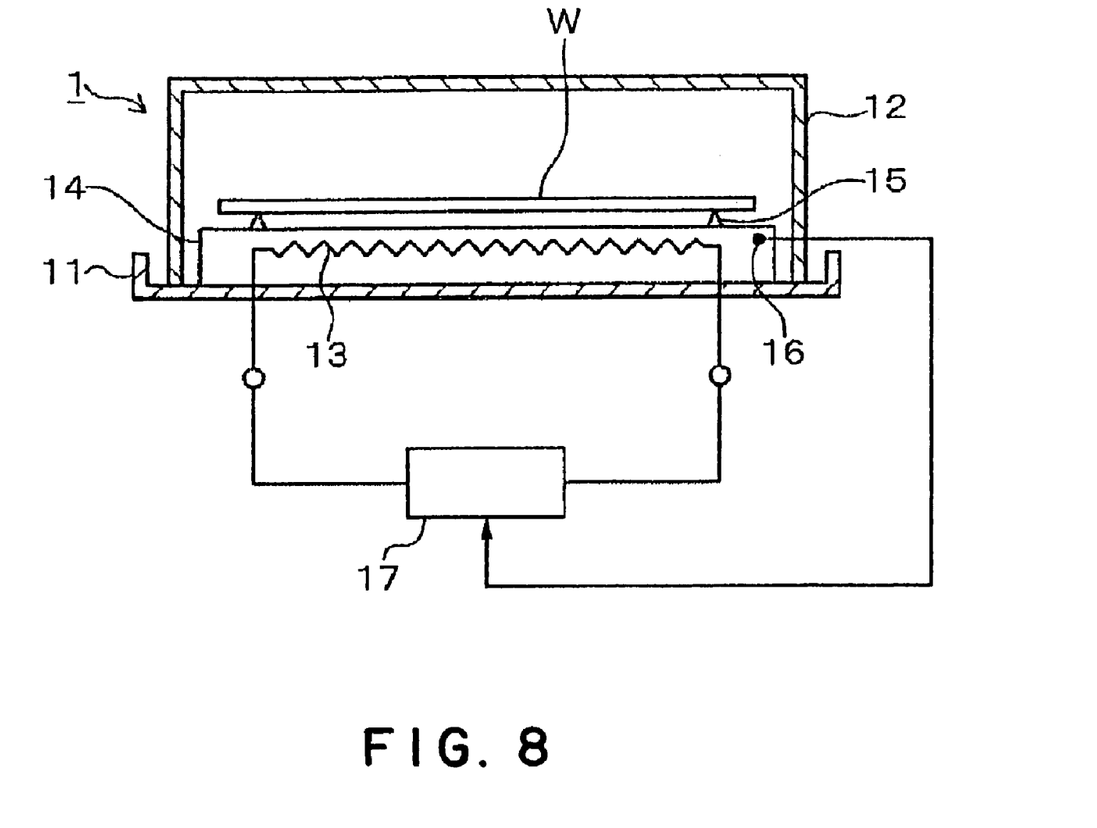
FIG. 8 is a schematic illustration showing a conventional substrate heating system.

This system comprises a heating plate 14 including a heater 13 in a processing vessel 1 which comprises a lower portion 11 and a lid 12. On the heating plate 14, protrusions 15 are provided. When a semiconductor wafer (which will be hereinafter referred to as a wafer) being a substrate is held in a horizontal attitude to be mounted on the heating plate 14, a gap of a very small distance, e.g., 0.1, is formed between the wafer W and the surface of the heating plate 14 so as to prevent particles from adhering to the surface of the heating plate 14. The lid 12 is connected to a gas supply pipe (not shown) for supplying, e.g., a purge gas of a room temperature, into the processing vessel 1 and to an exhaust pipe (not shown) for exhausting from the processing vessel 1. These serve to form an air flow in the vicinity of the surface of the wafer W during a process to prevent a temperature distribution from being caused on the surface.

The control of the temperature of the wafer W in the above described system is carried out by detecting the temperature of the surface portion of the heating plate 14 by means of a temperature sensor 16, feeding back a detected signal to a control system 17, and controlling the power of the heater 13 so that the temperature of the surface portion of the heating plate 14 is held at a predetermined process temperature. Various conditions during the process are constant until the end of the process from the start thereof. Specifically, the wafer W is heated to, e.g., 100° C., and this state is continued for 90 seconds to complete the processing.

By the way, the inventor has grasped that the line width of a resist pattern finally formed on the surface of the wafer W varies when processing conditions vary in the PAB if a certain resist (e.g., KrF-acetal) is used. Therefore, the PAB has some influence on the quality of the resist film. However, it has not been understood how to view the processing conditions to stabilize the quality of the resist film.

As described above, the object of the PAB is to heat (bake) the wafer W, on which the resist solution is applied, before exposure to volatilize a predetermined amount of a solvent contained in the resist solution. Therefore, the inventor has noticed the heating time to examine the correlation between the heating time and the resist film after the processing, and has noticed characteristics (Rmin) of the resist film to learn that there is a predetermined correlation between the characteristics of the resist film and the heating time. The Rmin shows a thickness h1 (see FIG. 9($a$)) of a dissolved resist film when a developing solution is supplied to an unexposed resist film which has completely heated in the PAB, and means that, as the value of h1 is smaller, the resist film is more stable to the developing solution, so that the inplane uniformity of the quality of the film is higher to increase the inplane uniformity of the line width.

Figure 9A:
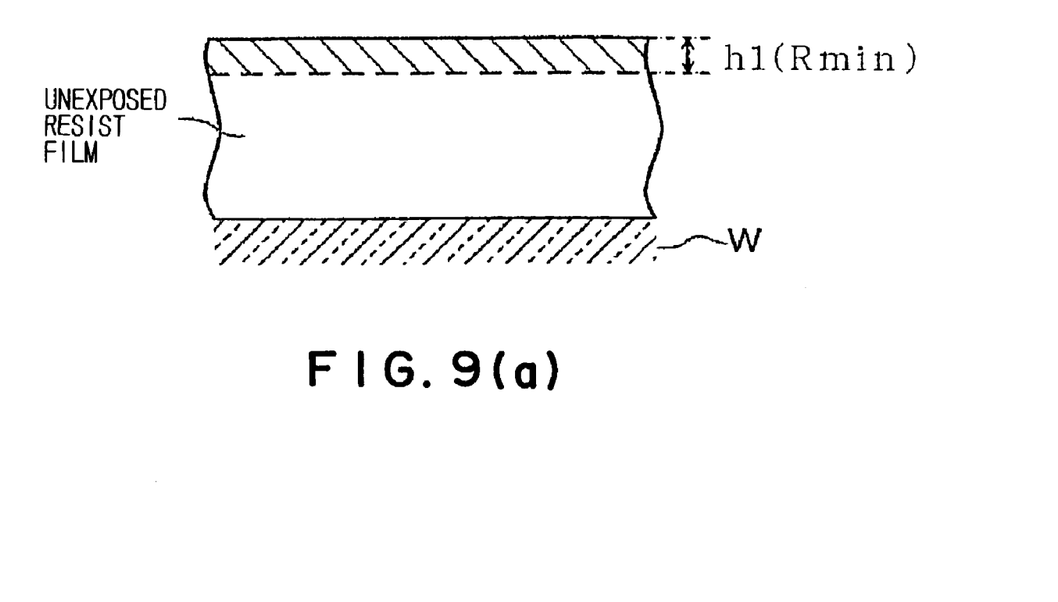
FIG. 9 is a schematic illustration for explaining the problem to be solved by the invention.

Then, as shown in a characteristic diagram of FIG. 9($b$), the value of Rmin is lowest at a heating time of t0, and a V shape is drawn about the lowest value. The reason why the value of Rmin thus varies is considered that the resist film is not substantially solidified (not stabilized) until t0 since the heating time is short. The Rmin after t0 is considered as follows. That is, since the decrease of the resist film during baking is mainly caused by the volatilization of the solvent, the total amount of a polymer forming resist components contained in the resist solution does not vary as shown in, e.g., FIG. 10($a$), and the proportion of the polymer in the whole resist film gradually increases. On the other hand, heating conditions are constant as described above, the proportion of thermal energy received by the polymer increases as the thickness of the film decreases as shown in, e.g., FIG. 10($b$). The excessive supply of thermal energy to the polymer causes the decomposition of a protective group of the polymer and the variation of the formation of the polymer. This is considered to increase the Rmin.

The foregoing suggests that the quality of the film can be optimized by changing the heating value applied to the resist film in accordance with the amount of volatilized solvent. However, since the ununiformity of the quality of the film can be eliminated by the conventional technique for always baking on constant process conditions regardless of the components of the resist film, the inventor has searched for a new heating method in the PAB.

DISCLOSURE OF THE INVENTION

The present invention has been made in such circumferences, and it is an object of the present invention to provide a technique capable of improving the inplane uniformity of the quality of a resist film in a heating processing, which is carried out before exposure, with respect to a substrate on which a resist solution is applied. It is another object of the present invention is to improve the yields of products when a substrate heating system for carrying out the same heating processing as that in the present invention is applied to an applying and developing system.

According to the present invention, there is provided a substrate heating method for heating a substrate, on which a resist solution is applied, in a processing vessel, the method comprising: a first step of applying thermal energy to the substrate to volatilize most of a solvent in the resist solution; and then, a second step of causing a heating value, which is applied to the substrate for a unit time, to be smaller than that at the first step to volatilize the solvent remaining in the resist film.

According to such a method, the heating value applied to the substrate can be changed in accordance with the variation in component of the resist solution when the substrate is heated, so that it is possible to enhance the inplane uniformity of the quality of the resist film. Specifically, it is possible to adapt a technique for previously grasping, e.g., the timing in changing the step between the first and second steps, on the basis of Rmin being an index of determination of the inplane uniformity of the film, monitoring the amount of the decrease of the thickness (the rate of the decrease of the thickness) during the heating processing, and using a switching timing when the rate is a predetermined value or less.

As the method for changing the heating value applied to the substrate, there are preferably used a method for causing the heating value applied to the substrate for a unit time, to be smaller than that at the first step by increasing the distance between the substrate and the heating plate as compared with that at the first step a method for decreasing the temperature of the heating plate by decreasing the power supplied to a resistance heating element provided in the heating plate, and a method for decreasing the temperature of the heating plate by supplying a refrigerant to the heating plate, when the substrate is mounted on the heating plate to heat the substrate by the heating plate. When a purge gas is supplied into a processing vessel, there may be used a method for changing the temperature of the purge gas. Furthermore, it is not required to monitor the amount of the decrease of the thickness of the resist solution in real time. For example, the timing in which the rate of the decrease of the thickness of the resist solution is small may be previously grasped, and the first and second steps may be changed in that timing.

BEST MODE FOR CARRYING OUT THE INVENTION

Figure 1:
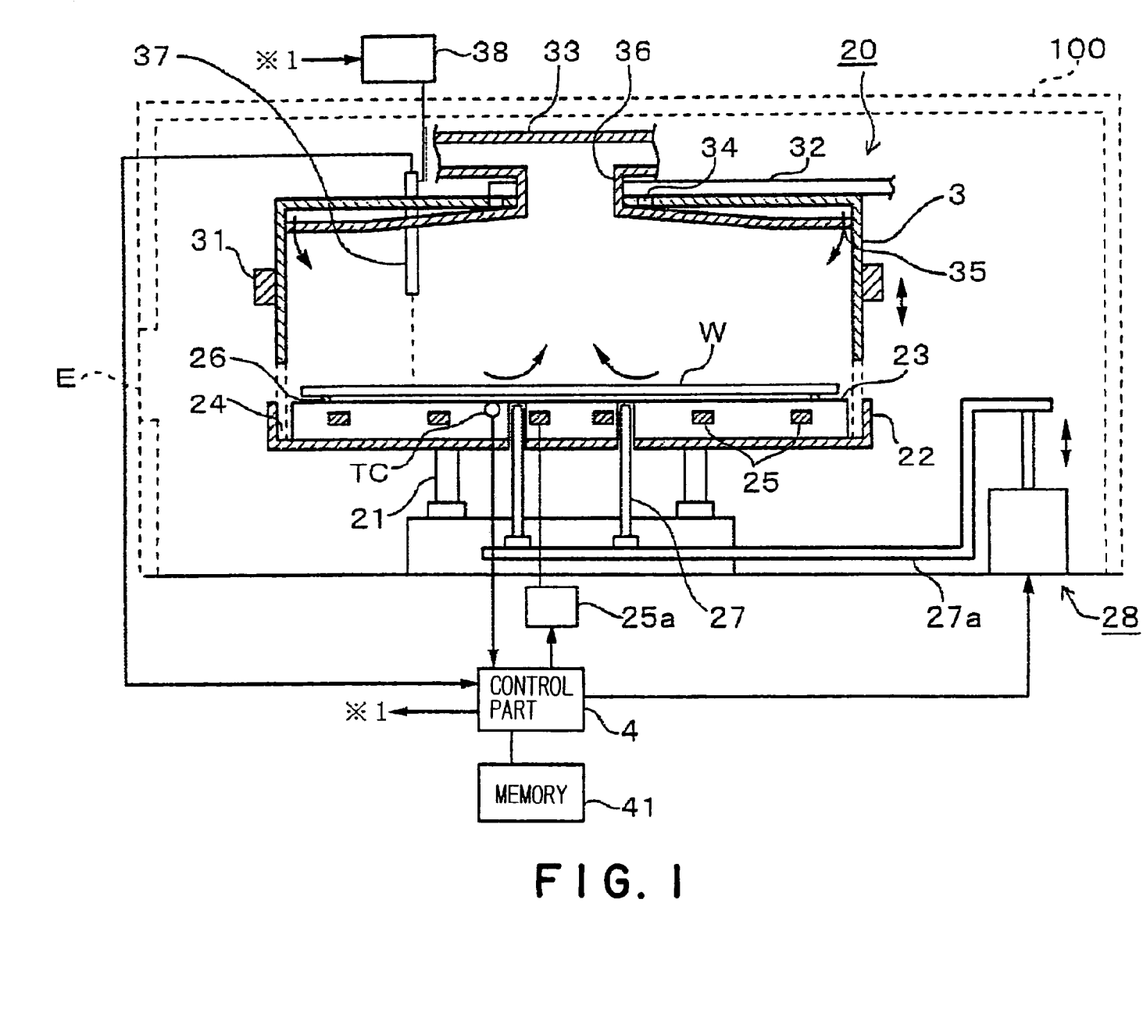
FIG. 1 is a longitudinal sectional view of a preferred embodiment of a substrate heating system according to the present invention.

Referring to the longitudinal sectional view of FIG. 1, a preferred embodiment (a first preferred embodiment) of a substrate heating system according to the present invention will be described below. In this system, a housing 100 houses therein a processing vessel 20 comprising a lower portion 22, the lower portion of which is supported on a leg portion 21, and a lid 3 which is vertically movable above the lower portion 22. In the side face of the housing 100, an opening portion E for carrying a wafer W being a substrate in and out of the housing 100 is formed. This processing vessel 20 will be described from the lower portion. Inside of the lower portion 22, a heating plate 23 being a cylindrical heating plate is provided. Between the internal wall face of the lower portion 22 and the external wall face of the heating plate 22, a recessed portion 24 is formed all around. The heating plate 23 serves as a supporting plate for the wafer W, and is made of, e.g., aluminum nitride (AlN).

In the vicinity of the surface (top face) of the heating plate 23, heaters 25 being a plurality of divided resistance heating elements, and a thermocouple TC being a temperature detecting means are buried. Temperature data obtained by the thermocouple TC are transmitted to a control part 4. The control part 4 is designed to control the electric energy, which is supplied to the heaters 25 via a power supply part 25a, on the basis of the temperature data. On the surface of the heating plate 23, three protrusions 26 having a height of, e.g., 0.1 mm, are provided at regular intervals in circumferential directions. The wafer W being a substrate is horizontally supported on these protrusions so as to be slightly spaced from the surface of the heating plate 23. Below the position at which the wafer W is supported, for example, three lift pins 27 are retractably provided so as to path through the heating plate 23. The lift pins 27 serve to deliver the wafer W between a wafer transfer arm (not shown) and the heating plate 23, and also serve to control the heating value, which is applied to the wafer W, by controlling the height during the process (the details thereof will be described later). For example, the height of the lift pins 27 can be changed by means of a lifting mechanism 28 which is a lifting means comprising a linear motor (not shown) and a supporting member 27a. The control of the driving of the driving mechanism 28 is carried out by the control part 4.

The upper portion of the processing vessel 20 will be described below. The lid 3 is vertically movable by a lifting member 31 connected to a driving mechanism (not shown). When the wafer W is heated, the bottom end of the lid is fitted into the recessed portion 24 to surround the wafer W. The lid 3 is connected to a gas supply pipe 32 being a purge gas supply means and an exhaust pipe 33, to supply a purge gas, such as nitrogen gas or air, into the processing vessel 20 from the gas supply pipe 32 via gas holes 34 and 35 and to exhaust the gas from the exhaust pipe 33 via an outlet 36 so as to be capable of forming an air flow on the surface of the wafer W (see arrows in the figure). The lid 3 is provided with a thickness detecting sensor 37 being a thickness monitoring means which passes through, e.g., the ceiling portion of the lid 3, so that the tip of the thickness detecting sensor 37 faces the wafer W. Thickness data of a resist film on the surface of the wafer W are transmitted to the control part 4. The thickness detecting sensor 37 is vertically movable by means of a positioning mechanism 38 so as to be capable of being spaced from, e.g., the wafer W by a predetermined distance, and the control thereof is carried out by the control part 4. The thickness detecting sensor 37 is an optical thickness detecting sensor for measuring the thickness by detecting reflected light from the liquid film.

As the thickness monitoring means, a solvent concentration detecting means may be used in place of the thickness detecting sensor 37. In this case, since the thickness decreases as the amount of volatilized solvent increases, the thickness can be known by detecting the concentration of the solvent.

By the way, the flow rate of the purge gas supplied into the processing vessel 20 via the gas supply pipe 32 is controlled by the control part 4 although it is not shown. That is, the control part 4 is designed to collectively control the flow rate of the purge gas and the temperature of the heaters 25. Such control is carried out in accordance with, e.g., a recipe which is prepared in accordance with the kind of the applied film and which is read from a memory 41.

The operation of the above described preferred embodiment will be described below. First, while the lid 3 is lifted by the driving mechanism (not shown), a wafer transfer arm (not shown) moves above the heating plate 23 via a gap between the lid 3 and the lower portion 22, and the wafer W is horizontally supported on the lift pin 27 protruding from the lower side. Then, when the lift pin moves downwards, the wafer W is horizontally supported on the protrusions 26. Then, when the lid 3 is moved downwards, a processing space for the wafer W is formed so as to be surrounded by the lid and the lower portion. Thereafter, in accordance with the predetermined recipe as described above, the heating by the heaters 25, and the supply and exhaust of a purge gas, e.g., $N_2$ (nitrogen) gas, into and from the processing vessel 20 are started.

At this time, the lift pin 27 is in a state that the lift pin 27 is completely buried below the surface of the heating plate 23, i.e., the wafer W is positioned at a height (first distance) of 0.1 mm from the heating plate 23, and the thickness detecting sensor 37 is positioned above the surface of the wafer W by, e.g., 5 mm to 10 mm. In this state, thickness data for the resist film on the surface of the wafer W are continued to be transmitted to the control part 4. Furthermore, the wafer W is moved upwards by the lift pin 27 in accordance with the proceeding of the heating process as will be described later. The height of the thickness detecting sensor 37 may be controlled by the positioning mechanism 38 in accordance with the upward movement. For example, the height may be controlled so that the distance from the wafer W is constant.

Figure 2:
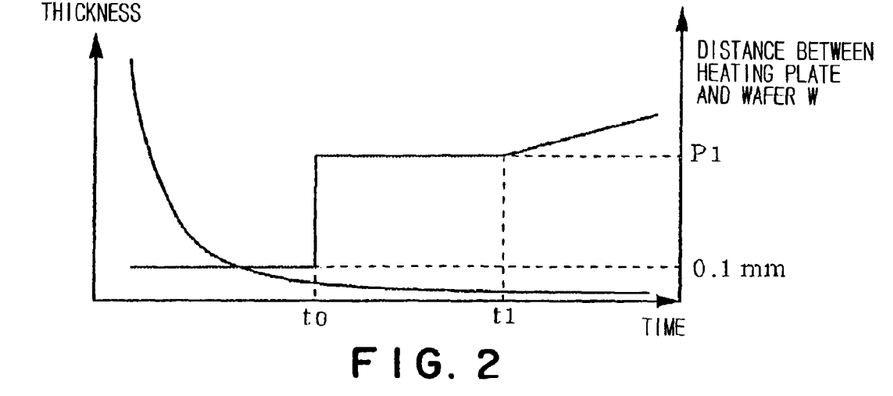
FIG. 2 is a graph showing operation in the preferred embodiment.
Figure 3:
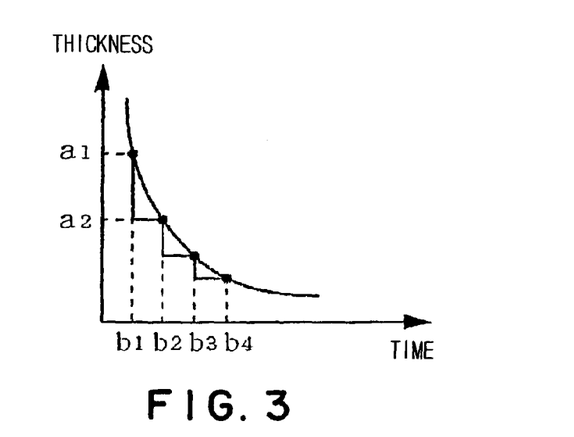
FIG. 3 is a graph showing operation in the preferred embodiment.
Figure 9B:
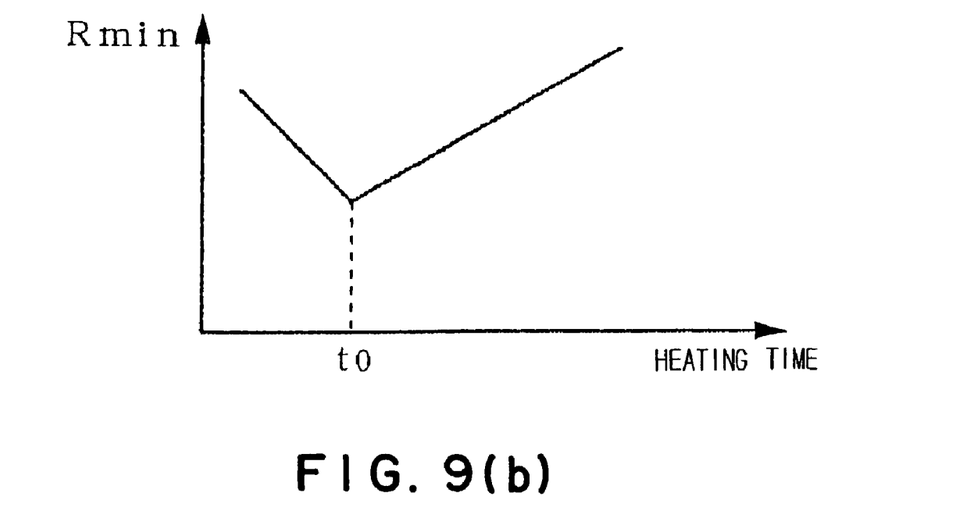

At the beginning of the starting of the heating, most of the heating value applied to the wafer W is used for volatilizing the solvent in the resist film, so that the thickness rapidly decreases as shown in the characteristic diagram of FIG. 2. However, as described "Problem to be solved by the Invention", since excessive heating value is applied to the polymer contained in the resist after a certain time, the heating value applied to the wafer W is controlled so as to be decreased. Then "certain time" corresponds to t0 shown in FIG. 9(b), and t0 is determined by the amount of the decrease of the thickness per unit time (which will be hereinafter referred to as a thickness decreasing rate). This can be calculated by dividing the value (a1–a2) of the decrease of the thickness between the times b1 and b2 by (b2–b1) as shown in, e.g., FIG. 3. This value decreases as the elapse of time as can be seen from the shown curve.

Figure 10A:
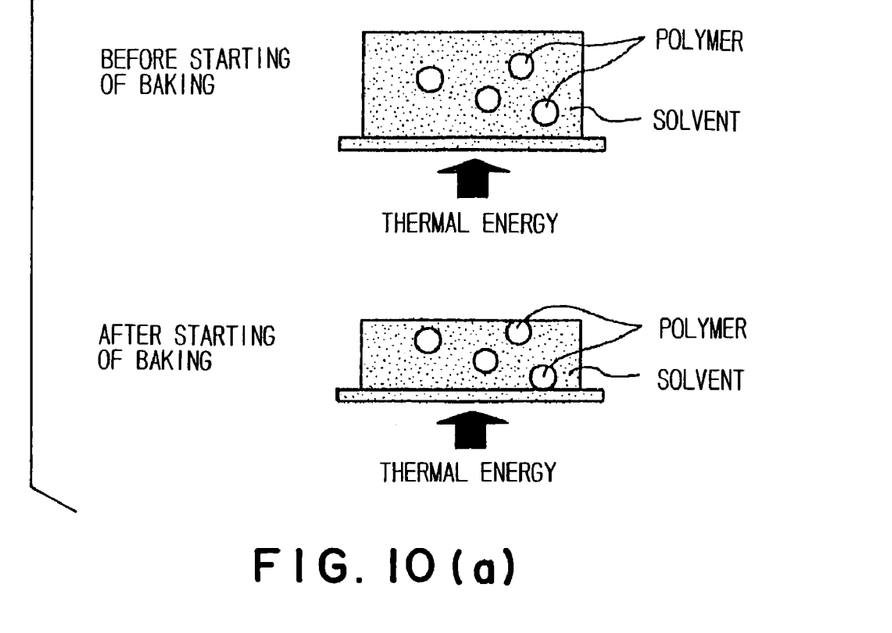
FIG. 10 is a schematic illustration for explaining the problem to be solved by the invention.
Figure 10B:
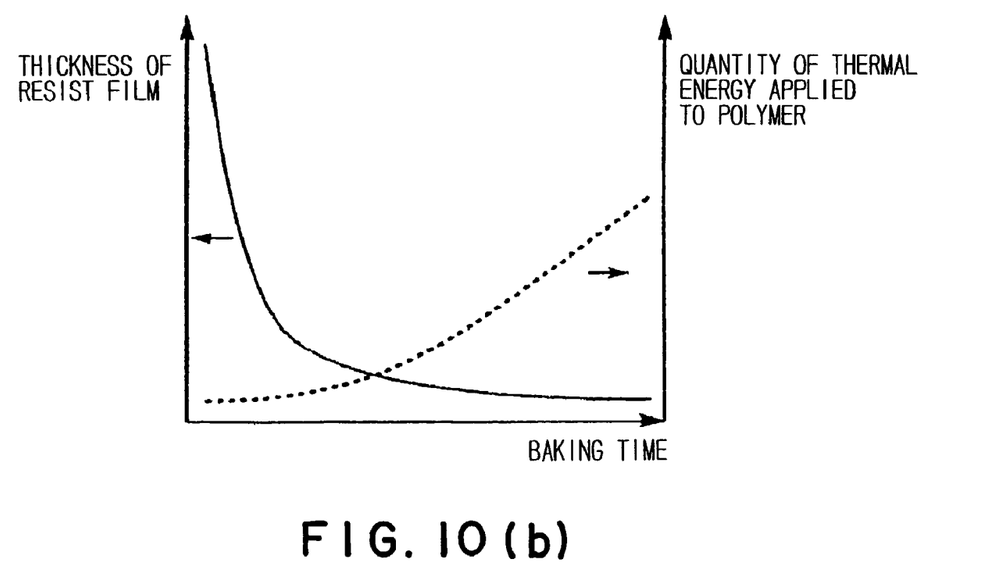

By the way, the relationship between the time of t0 and the thickness decreasing rate is previously grasped by the relationship between FIG. 9(b) and 10(b). Assuming that a step before the time of t0 is a first step and a step after t0 is a second step, the second step is a step of successively volatilizing the solvent in the resist film while inhibiting excessive heating value from being applied to the polymer by decreasing the heating value (thermal energy per unit time applied to the wafer W. Therefore, if the control part 4 grasps that the time reaches t0, i.e., when the amount of the decrease of the thickness calculated on the basis of the detected value of thickness from the thickness detecting sensor 37 is lower than a preset value, the control part 4 gives a command to the lifting mechanism 28 so that the heating value applied to the wafer W decreases to a predetermined value, to move the lift pin 27 upwards. The relationship between the height of the lift pin and the heating value applied to the wafer W for a unit time has been previously grasped on the basis of the heating pattern of the heaters 25 which is recorded in the recipe, and the lift pin 27 moves upwards to the height P1 (second distance) on the basis of the data.

The height P1 of the lift pin 27 at the time of t0 is set so that the heating value applied to the wafer W for a unit time is slightly lower than, e.g., a limit value at which the polymer protective group is decomposed. After the value of the heating value approaches the limit value at the time of t1 again, the heating value applied to the wafer W is decreased while the lift pin 27 is gradually moved upwards. After the lift pin 27 is moved upwards once at the time of t0, the height may be freely changed in accordance with the variation in temperature and the contents of the processing. Therefore, while the lift pin 27 has been gradually moved upwards after the time of t1 as an example, the lift pin 27 may be moved downwards, or may be moved upwards after being moved downwards once.

Thus, the wafer W moves upwards (or downwards) between a distance of 0.1 mm from the heating plate 23 (a state that the lift pin 27 does not move upwards) and a distance of, e.g., 25 mm from the heating plate 23, and after the process is completed, the wafer W is carried out of the processing vessel 20 by the reverse procedure of that during the carrying-in.

As described above, according to this preferred embodiment, the relationship between the index (Rmin) indicative of the inplane uniformity of the quality of the resist film formed on the surface of the wafer W and the heating time for the wafer W in the PAB is noticed, and the height of the wafer W is changed in accordance with the thickness decreasing rate of the resist film to control the heating value applied to the resist film, so that it is possible to optimize the quality of the resist film. That is, large thermal energy is applied to promote volatilization until most of the solvent is volatilized, and thereafter, excessive heating value is prevented from being applied to the protective groups and polymer while the remaining slight solvent is volatilized, so that it is possible to ensure a good quality of film while rapidly carrying out heating (backing). In addition, since there is a correlation between the inplane uniformity of the quality of the resist film and the precision of the line width of the resist pattern obtained after exposure being a postprocessing as described above, a resist pattern having a high precision of line width can be obtained from the optimized resist film.

Moreover, when a plurality of processes are sequentially carried out, the processes are conventionally carried out so as to be always a constant heating pattern, whereas thermal energy applied to the resist film is changed in accordance with the variation in component of the resist film in this preferred embodiment. Therefore, the processing of any one of the wafers W can be optimized, so that it is possible to improve yields.

Furthermore, the technique for controlling thermal energy applied to the wafer W during the heating in this preferred embodiment should not be limited to a technique that the distance between the wafer W and the heating plate 23 is changed as described above. For example, the same effects can be obtained by changing the surface temperature of the heating plate 23 as the second preferred embodiment which will be described below.

Figure 4:
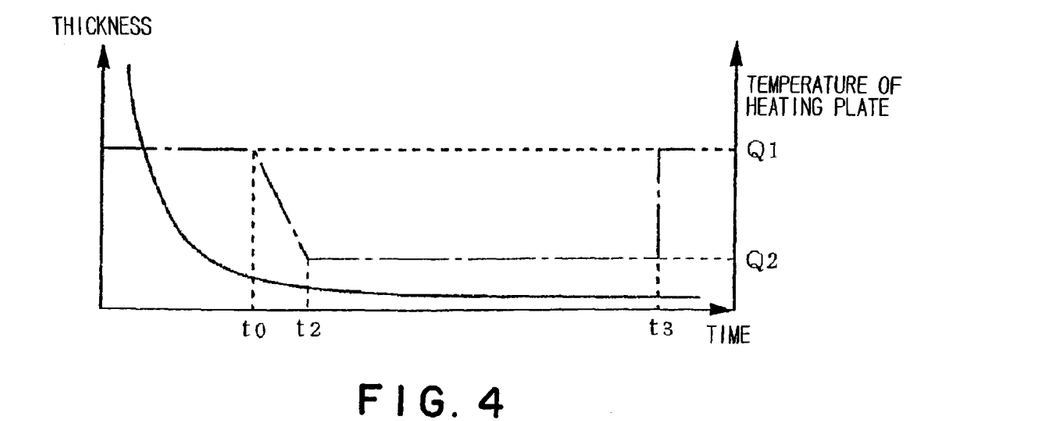
FIG. 4 is a graph showing another preferred embodiment of a substrate heating system according to the present invention.

In this preferred embodiment, the control of the temperature of the heating plate 23 is intended to be realized by controlling the electric energy supplied to the heaters 25. FIG. 4 is a characteristic diagram showing the relationship between the variation in thickness when a heating process is carried out and the temperature of the heating plate 23 (the temperature of the thermocouple TC). As shown in the figure, the control part 4 maintains the temperature of the heating plate 23 at a temperature of Q1 (a first temperature) at a first step to positively volatilize the solvent, and grasps the timing of t0 on the basis of thickness data obtained by the thickness detecting sensor 37 similar to the above described preferred embodiment, to decrease the output value in the power supply part at the time of t0 to change the step to a second step.

Then, the temperature of the heating plate 23 suddenly decreases to be a temperature of Q2 (a second temperature), which is lower than Q1 by, e.g., 10° C. to 20° C., at the time of t2 to be maintained as it is. When the process is completed at the time of t3, the control part 4 raises the temperature of the heaters 25 until the temperature of the heating plate 23 is equal to the temperature Q1 at the first step, and prepares the next processing to carry the processed wafer W out of the processing vessel 20 and to carry a new unprocessed wafer in, to similarly repeat the heating for a predetermined number of wafers. The method for changing the surface temperature of the heating plate 23 should not be limited to the control of the electric energy to the heaters 25. For example, a refrigerant passage (not shown) is formed in the heating plate 23 to cause a refrigerant to flow in an appropriate timing so that the surface temperature of the heating plate 23 is similar to that in FIG. 4. Alternatively, a cooling gas for causing a refrigerant to contact the reverse of the heating plate 23 may be supplied.

Figure 5A:
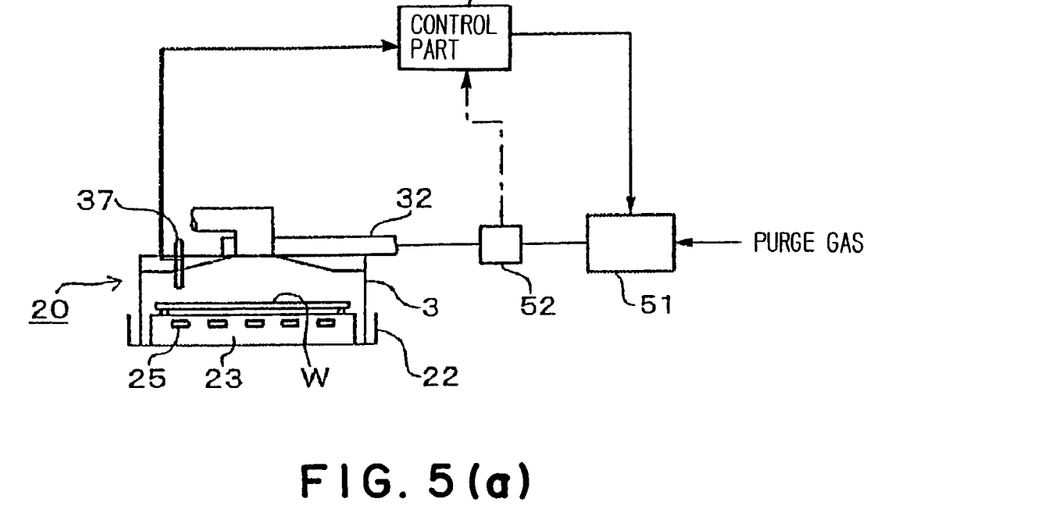
FIG. 5 is a schematic diagram for explaining a further preferred embodiment of a substrate heating system according to the present invention.
Figure 5B:
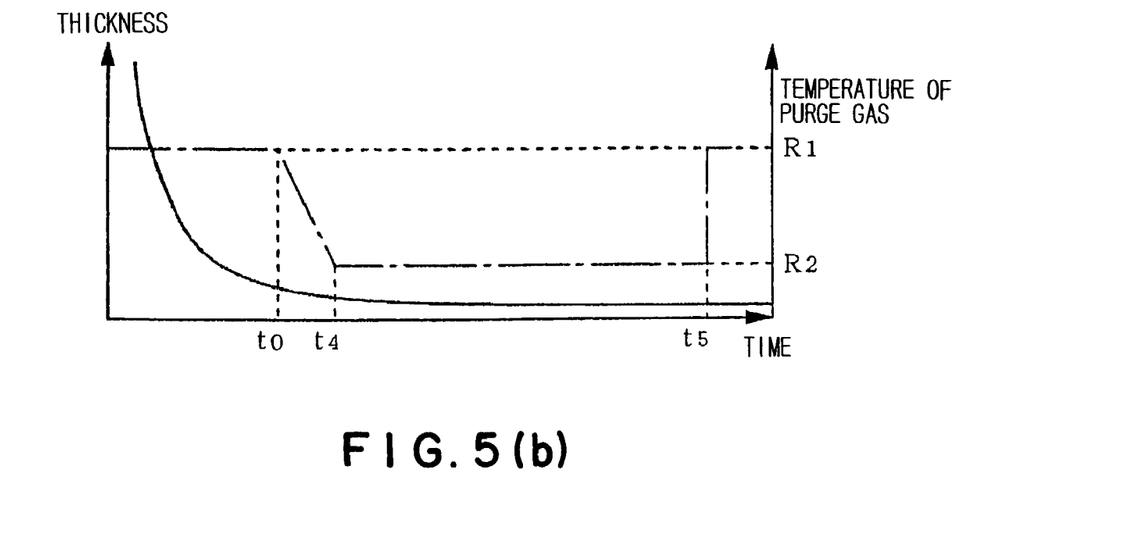

If the control of thermal energy applied to the wafer W is carried out by changing the temperature of a purge gas, the same effects as those in the above described example can be obtained. FIG. 5(a) is a schematic illustration showing a purge gas supply system in this third preferred embodiment. In this preferred embodiment, a temperature control part 51 capable of changing the temperature of a purge gas, e.g., air, between 0° C. and 30° C., and a flow meter 52 are provided in order thereof from the upstream in the middle of the gas supply pipe 32 in the first preferred embodiment. FIG. 5(b) is a characteristic diagram showing the variation in thickness and the variation in temperature of the purge gas in this preferred embodiment. First, the control part 4 determines the time of t0 on the basis of thickness data while maintaining the temperature of the purge gas at R1 at the step of t0, and suddenly decrease the gas temperature in the temperature control part 51 on the basis of the flow rate of the purge gas obtained from the flow meter 52, at the time of t0. Then, at the time of t4 at which the temperature of the purge gas decreases to R2, the temperature of the gas is maintained as it is. When the processing is completed, the gas temperature is returned to R1, and the next unprocessed wafer W is prepared to be carried in. Furthermore, since the heating value applied to the wafer W per unit time may be decreased after the time of t0, the supplied heating value may be controlled by combining the temperature of the purge gas with the flow rate thereof.

While the time of to has been determined in real time in the above described preferred embodiment, the control part may change the control from the first step to the second step at a certain time on the basis of previously acquired data. In this case, a dummy wafer may be used for carrying out a heating process while measuring the variation in thickness of the resist film by means of, e.g., a thickness detecting sensor, and for deriving a time, at which most of the solvent in the resist solution is volatilized, on the basis of data of the variation in thickness decreasing rate, and that time may be stored in a memory. Thereafter, a wafer W for product is used for carrying out a heating process on the basis of the calculated results without measuring the thickness. Here, the sentence "most of the solvent in the resist solution is volatilized" means favorably that 50%–98% of the solvent in the resist solution is volantized, but more realistically that 50%–80% of the solvent in the resist solution is volantized.

The terms "first temperature", "second temperature", "first distance" and "second distance" in claims should not mean that they are always constant values, and include cases where the values gradually change. That is, for example, in the second preferred embodiment, the temperature Q1 corresponding to the first temperature may change between the starting of the heating and the time of t0 so long as it is maintained to be higher than the temperature Q2 corresponding to the second temperature. Specifically, the temperature Q1 may gradually decrease before t0, and suddenly decrease after the time of t0.

Figure 6:
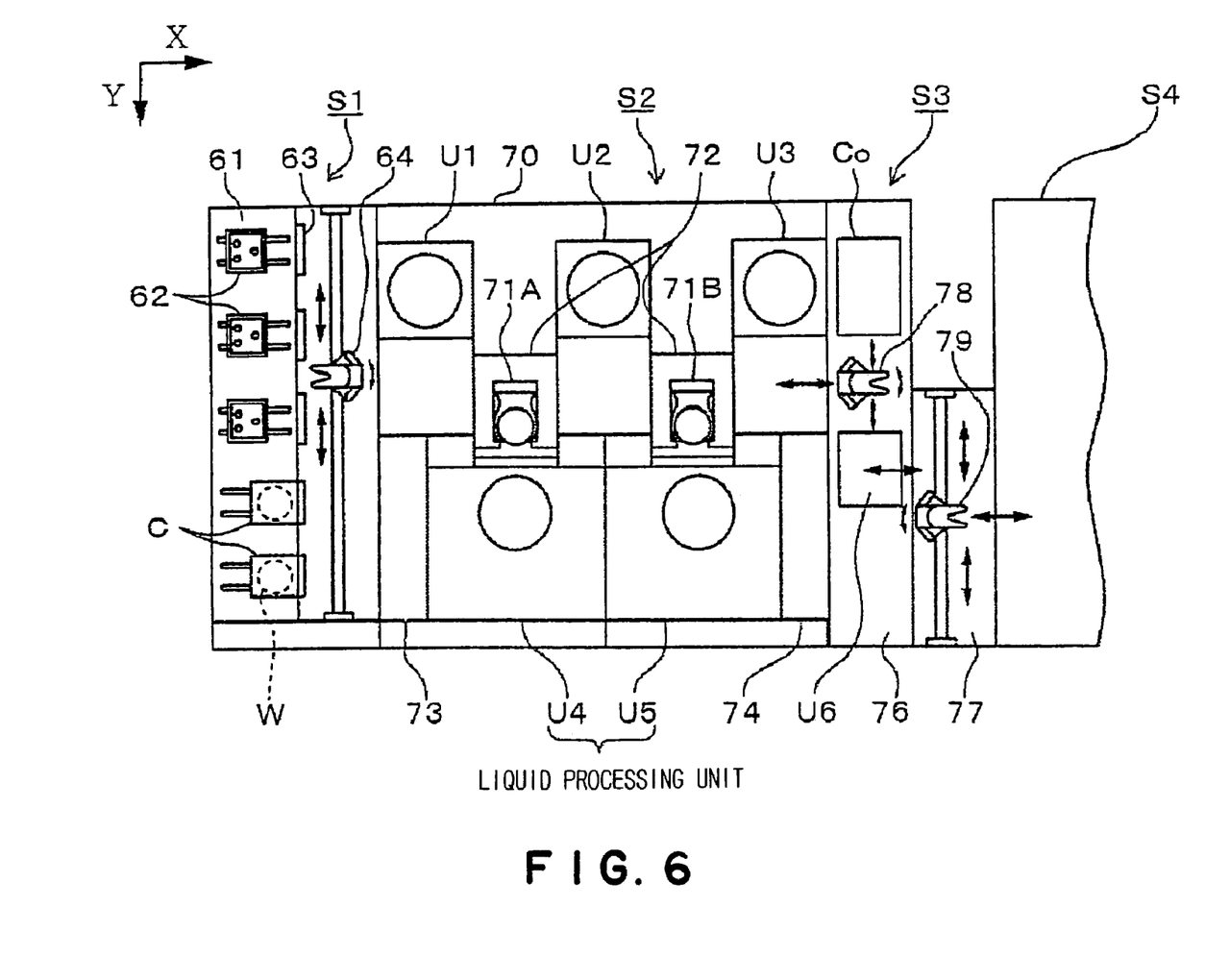
FIG. 6 is a plan view showing an example of an applying and developing system including the substrate heating system.

Finally, referring to FIGS. 6 and 7, an example of an applying and developing system including the above described substrate heating system as a unit will be described below. In the figure, S1 denotes a cassette supporting part for carrying a cassette C housing therein a plurality of, e.g., 13, wafers, in and out. The cassette supporting part is provided with a supporting table 61 capable of supporting thereon a plurality of cassettes C, and a delivery means 62 for taking the wafers W out of the cassettes C.

Inside of the cassette supporting part S1, a processing part S2 surrounded by a housing 7O is provided. This processing part S2 is alternately provided with shelf units U1, U2 and U3 including heating/cooing units including the above described substrate heating system as multi stages, and main transfer means 71A, 71B for delivering the wafers W between the respective processing units including an applying/developing unit which will be described below. That is, the shelf units U1, U2, U3 and the main transfer means 71A, 71B are aligned in longitudinal directions as being viewed from the cassette supporting part Si, and each of connecting portions is provided with a wafer carrying opening portion (not shown), so that the wafer W can freely move in the processing part S1 from the shelf unit U1 at one end to the shelf unit U2 at the other end. The main transfer means 71A and 71B are arranged in a space surrounded by partition walls 72 which comprise one face portion on the side of the shelf units U1, U2 and U3 arranged in longitudinal directions as being viewed from the cassette supporting part S1, one face portion on the side of liquid processing units U4 and U5 which are arranged on, e.g., right side, and which will be described later, and a back face portion being one face on the left side. In the figure, reference numbers 73 and 74 denote a temperature/humidity control unit having a processing solution temperature control unit and a temperature/humidity control duct which are used for each unit.

Figure 7:
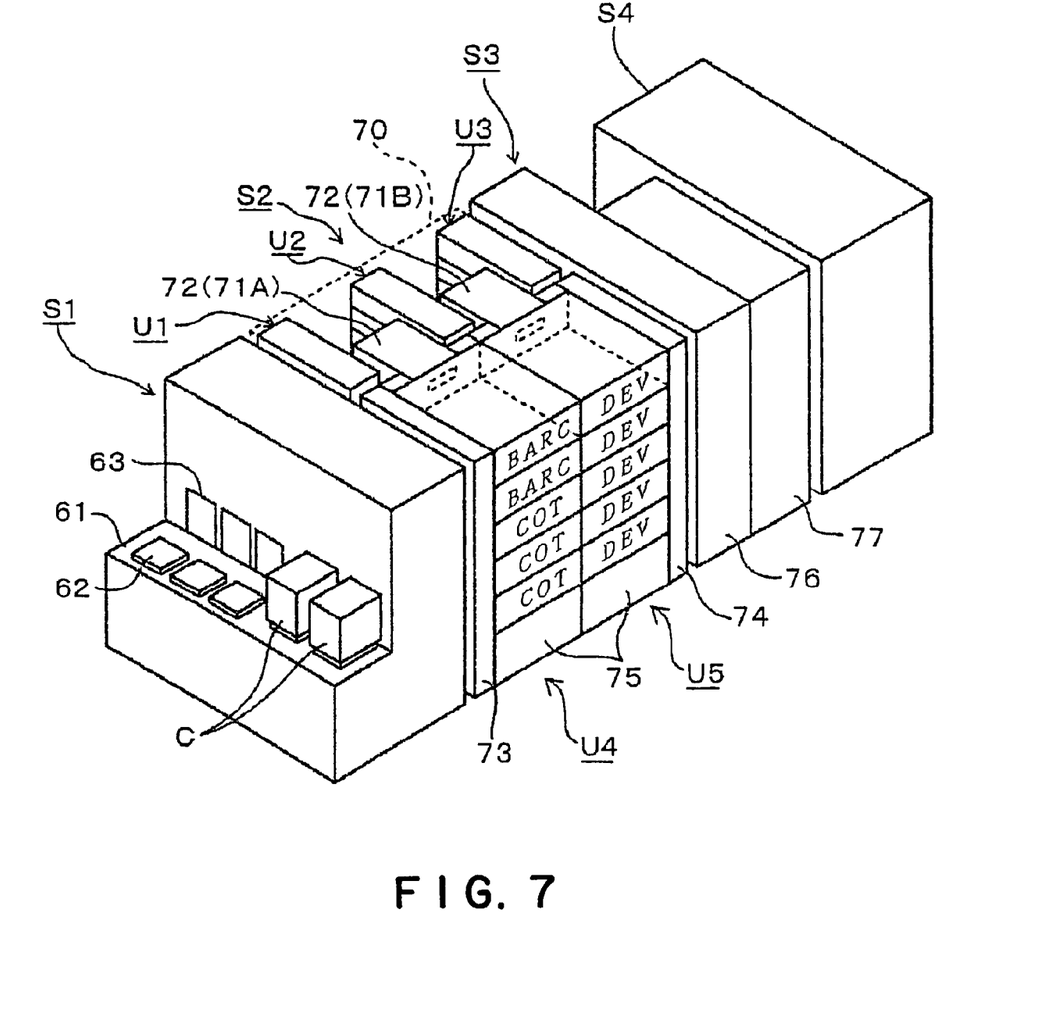
FIG. 7 is a perspective view showing an example of an applying and developing system including the substrate heating system.

As shown in, e.g., FIG. 7, the liquid processing units U4 and U5 comprise a housing portion 75 defining a space for supplying chemicals, such as applying solution (resist solution) and developing solution, and an applying unit COT, a developing unit DEV and a reflection preventing film forming unit BARC which are stacked on the housing portion 75 in a plurality of stages, e.g., 5 stages. In the above described shelf units U1, U2 and U3, various units for carrying out a pre-processing and a post-processing before and after the processing carried out by the liquid processing units U4 and U5 are stacked in a plurality of stages, e.g., 10 stages.

Inside of the shelf unit U3 in the processing part S2, an exposure part S4 is provided via an interface part S3. The interface part S3 comprises a first transfer chamber 76 and a second transfer chamber 77 which are provided between the processing part S1 and the exposure part S4. The interface part S3 includes two delivery means 78 and 79, a shelf unit U6 and a buffer cassette C0, so as to be capable of carrying a wafer W, which is arranged in, e.g., the shelf unit U6, and on which an applying solution is applied, in a route of delivery means 78→shelf unit U6→delivery means 79→exposure part S4. The exposed wafer W is returned to the processing part S2 in the reverse route, and stored in the cassette C after being developed.

As described above, according to the present invention, it is possible to improve the inplane uniformity of the quality of the resist film with respect to the substrate, on which the resist solution is applied, in the heating processing carried out before exposure. According to another invention, it is possible to improve the yields of products when the substrate heating system for carrying out the same heating processing as that in the present invention is applied to an applying and developing system.

The invention claimed is:

1. A substrate heating system for heating a substrate, on which a resist solution is applied, in a processing vessel, said system comprising:
a heating plate which is provided in a processing vessel and on which a substrate is arranged; and
control means for setting a temperature of the heating plate to be a first temperature until most of a solvent in a resist solution is volatilized, and thereafter, setting the temperature to be a second temperature, which is lower than the first temperature, while the solvent remaining in a resist film is volatilized.

2. A substrate heating system as set forth in claim 1, which further comprises thickness monitoring means for monitoring a liquid film of the resist solution, and
wherein said control means determines that most of the solvent in the resist solution is volatilized, on the basis of a result of monitoring by said thickness monitoring means to change a set value.

3. A substrate heating system as set forth in claim 2, wherein said thickness monitoring means is an optical thickness detecting sensor.

4. A substrate heating system as set forth in claim 2, wherein said thickness monitoring means is solvent concentration detecting means for detecting a concentration of the solvent in the liquid film.

5. A substrate heating system as set forth in claim 1, wherein a timing in changing of a thickness decreasing amount per unit time to a small value with respect to a liquid film of the resist solution is previously grasped, and said control means changes a set value in that timing.

6. A substrate heating system for heating a substrate, on which a resist solution is applied, in a processing vessel, said system comprising:
a heating plate which is provided in a processing vessel and on which a substrate is arranged;
purge gas supply means for supplying a purge gas into the processing vessel; and
control means for setting a temperature of the purge gas to be a first temperature until most of a solvent in a resist solution is volatilized, and thereafter, setting the temperature to be a second temperature, which is lower than the first temperature, while the solvent remaining in a resist film is volatilized.

7. A substrate heating system as set forth in claim 6, which further comprises thickness monitoring means for monitoring a liquid film of the resist solution, and
wherein said control means determines that most of the solvent in the resist solution is volatilized, on the basis of a result of monitoring by said thickness monitoring means to change a set value.

8. A substrate heating system as set forth in claim 7, wherein said thickness monitoring means is an optical thickness detecting sensor.

9. A substrate heating system as set forth in claim 7, wherein said thickness monitoring means is solvent concentration detecting means for detecting a concentration of the solvent in the liquid film.

10. A substrate heating system as set forth in claim 6, wherein a timing in changing of a thickness decreasing amount per unit time to a small value with respect to a liquid film of the resist solution is previously grasped, and said control means changes a set value in that timing.

11. A substrate heating for heating a substrate, on which a resist solution is applied, in a processing vessel, said system comprising:
a heating plate which is provided in a processing vessel and on which a substrate is arranged;
lifting means for relatively vertically moving the substrate with respect to the heating plate; and
control means for setting a distance between the substrate and the heating plate, to be a first distance until most of a solvent in a resist solution is volatilized, and thereafter, setting the distance to be a second distance, which is greater than the first distance, while the solvent remaining in a resist film is volatilized,
wherein a timing in changing of a thickness decreasing amount per unit time to a small value with respect to a liquid film of the resist solution is previously grasped, and said control means changes a set value in that timing.

12. A substrate heating system as set forth in claim 11, which further comprises thickness monitoring means for monitoring a liquid film of the resist solution, and
wherein said control means determines that most of the solvent in the resist solution is volatilized, on the basis of a result of monitoring by said thickness monitoring means to change a set value.

13. A substrate heating system as set forth in claim 12, wherein said thickness monitoring means is an optical thickness detecting sensor.

14. A substrate heating system as set forth in claim 12, wherein said thickness monitoring means is solvent concentration detecting means for detecting a concentration of the solvent in the liquid film.

15. An applying and developing system comprising:
a cassette stage on which a substrate cassette housing therein a plurality of substrates is mounted;
an applying unit for applying a resist solution on the substrates;
a pre-processing unit for pre-processing the substrates before the resist solution is applied on the substrates;
a substrate heating system for heating the substrates, on which the resist solution is applied, as set forth in claim 11;
a developing unit for developing the substrates after exposure; and
means for delivering the substrates between the substrate cassette, applying unit, pre-processing unit, substrate heating system and developing unit.

16. An applying and developing system comprising:
a cassette stage on which a substrate cassette housing therein a plurality of substrates is mounted;

an applying unit for applying a resist solution on the substrates;

a pre-processing unit for pre-processing the substrates before the resist solution is applied on the substrates;

a substrate heating system for heating the substrates, on which the resist solution is applied, as set forth in claim 1;

a developing unit for developing the substrates after exposure; and means for delivering the substrates between the substrate cassette, applying unit, pre-processing unit, substrate heating system and developing unit.

17. An applying and developing system comprising:

a cassette stage on which a substrate cassette housing therein a plurality of substrates is mounted;

an applying unit for applying a resist solution on the substrates;

a pre-processing unit for pre-processing the substrates before the resist solution is applied on the substrates;

a substrate heating system for heating the substrates, on which the resist solution is applied, as set forth in claim 6;

a developing unit for developing the substrates after exposure; and means for delivering the substrates between the substrate cassette, applying unit, pre-processing unit, substrate heating system and developing unit.

* * * * *